US010244301B2

(12) United States Patent
Kindred (10) Patent No.: US 10,244,301 B2
(45) Date of Patent: Mar. 26, 2019

(54) POWER MANAGEMENT SHELL FOR EAR-WORN ELECTRONIC DEVICE

(71) Applicant: Starkey Laboratories, Inc., Eden Prairie, MN (US)

(72) Inventor: Jon Kindred, Minneapolis, MN (US)

(73) Assignee: Starkey Laboratories, Inc., Eden Prairie, MN (US)

( * ) Notice: Subject to any disclaimer, the term of this patent is extended or adjusted under 35 U.S.C. 154(b) by 0 days.

(21) Appl. No.: 15/789,435

(22) Filed: Oct. 20, 2017

(65) Prior Publication Data

US 2018/0124492 A1    May 3, 2018

Related U.S. Application Data

(60) Provisional application No. 62/413,507, filed on Oct. 27, 2016.

(51) Int. Cl.
| | | |
|---|---|---|
| H05K 7/02 | (2006.01) | |
| H05K 7/04 | (2006.01) | |
| H04R 1/10 | (2006.01) | |
| H04R 25/00 | (2006.01) | |
| H05K 5/00 | (2006.01) | |
| H01L 51/00 | (2006.01) | |

(52) U.S. Cl.
CPC ....... *H04R 1/1025* (2013.01); *H01L 51/0048* (2013.01); *H04R 25/602* (2013.01); *H04R 25/652* (2013.01); *H05K 5/0086* (2013.01); *H04R 1/1008* (2013.01); *H04R 1/1016* (2013.01); *H04R 1/1058* (2013.01); *H04R 25/55* (2013.01); *H04R 25/658* (2013.01); *H04R 2225/021* (2013.01); *H04R 2225/31* (2013.01); *H04R 2225/33* (2013.01)

(58) Field of Classification Search
CPC ... H04R 1/1025; H04R 25/602; H05K 5/0086
USPC .......................................... 361/811
See application file for complete search history.

(56) References Cited

U.S. PATENT DOCUMENTS

| | | | |
|---|---|---|---|
| 5,889,874 A * | 3/1999 | Schmitt | H04R 25/60 381/322 |
| 6,031,923 A * | 2/2000 | Gnecco | H04R 25/60 174/350 |
| 6,507,271 B2 | 1/2003 | Taguchi et al. | |
| 6,829,364 B2 | 12/2004 | Andersen et al. | |

(Continued)

FOREIGN PATENT DOCUMENTS

| | | |
|---|---|---|
| DE | 4241255 | 4/1993 |
| WO | WO9955131 | 11/1999 |

OTHER PUBLICATIONS

International Search Report and Written Opinion dated Feb. 27, 2018 from counterpart PCT App. No. PCT/US2017/057633, 12 pages.

(Continued)

*Primary Examiner* — Hung S. Bui
(74) *Attorney, Agent, or Firm* — Hollingsworth Davis, LLC (57) ABSTRACT

An ear-worn electronic device comprises a shell defining an enclosure of the device. Electronics are disposed within a void in the enclosure. One or more capacitors, which may be supercapacitors, are situated on or within the shell and coupled to the electronics. The one or more capacitors can be part of a circuit of the electronics that provides power management for the ear-worn electronic device.

20 Claims, 9 Drawing Sheets

(56) References Cited

U.S. PATENT DOCUMENTS

| | | | |
|---|---|---|---|
| 7,142,682 B2* | 11/2006 | Mullenborn | H04R 19/005 |
| | | | 381/322 |
| 9,439,007 B2* | 9/2016 | Naumann | H04R 25/604 |
| 9,715,966 B2* | 7/2017 | Newberry | H01G 4/008 |
| 2001/0032666 A1 | 10/2001 | Jenson et al. | |
| 2002/0196956 A1 | 12/2002 | Andersen et al. | |
| 2008/0002847 A1 | 1/2008 | Geiger | |
| 2009/0262964 A1* | 10/2009 | Havenith | H04R 25/505 |
| | | | 381/314 |
| 2010/0034410 A1 | 2/2010 | Link et al. | |
| 2010/0195858 A1 | 8/2010 | Rasmussen et al. | |
| 2010/0259866 A1 | 10/2010 | Shaffer et al. | |
| 2010/0320569 A1 | 12/2010 | Narita | |
| 2013/0002395 A1 | 1/2013 | Luizi et al. | |
| 2013/0243230 A1 | 9/2013 | Angst et al. | |
| 2014/0197531 A1 | 7/2014 | Bolognia | |
| 2015/0147573 A1* | 5/2015 | Zhang | C01B 31/0253 |
| | | | 428/408 |
| 2016/0277852 A1 | 9/2016 | Lee et al. | |
| 2017/0127196 A1 | 5/2017 | Blum et al. | |

OTHER PUBLICATIONS

Alresheeni, "Supercapacitors Based on Carbon Nanotube Fuzzy Fabric Structural Composites", Dissertation submitted to the School of Engineering of the University of Dayton, Dec. 2012, 159 pages.

Bae et al., "Fiber Supercapacitors Made of Nanowire-Fiber Hybrid Structures for Wearable/Flexible Energy Storage", Angewandte Chemie, Int. Ed., 2011, pp. 1-6.

IPI Singapore, Fiber Supercapacitor for Wearable Applications, printed from internet on Sep. 14, 2017, 2 pages.

Johnson, "Fiber-like Supercapacitors Could be Woven into Wearable Electronics", IEEE Spectrum, May 13, 2014, 2 pages.

Le et al., "Coaxial Fiber Supercapacitor Using All-Carbon Material Electrodes", ACS Nano, No. 7, vol. 7, Jun. 3, 2013, pp. 5940-5947.

Meng, "A Review of Flexible and Weaveable Fiber-Like Supercapacitors". Journal of Postdoctoral Research, vol. 1, No. 12, Dec. 2013, 16 pages.

Vilatela et al., "Tough Electrodes: Carbon Nanotube Fibers as the Ultimate Current Collectors/Active Material for Energy Management Devices", Chemistry of Materials, No. 27, 2015, pp. 6901-6917.

Yu et al., "Scalable synthesis of hierarchically structured carbon nanotube-graphene fibres for capacitive energy storage", Nature Nanotechnology, 2014, 32 pages.

\* cited by examiner

POWER MANAGEMENT SHELL FOR EAR-WORN ELECTRONIC DEVICE

RELATED PATENT DOCUMENTS

This application claims the benefit of Provisional Patent Application Ser. No. 62/413,507 filed on Oct. 27, 2016, to which priority is claimed pursuant to 35 U.S.C. § 119(e), and which is incorporated herein by reference in its entirety.

TECHNICAL FIELD

This application relates generally to ear-worn electronic devices, including hearing devices, hearing aids, personal amplification devices, and other hearables.

BACKGROUND

Hearing devices provide amplified sound for the wearer. Some examples of hearing devices are headsets, hearing aids, in-ear monitors, cochlear implants, bone conduction devices, and personal listening devices. For example, hearing aids provide amplification to compensate for hearing loss by transmitting amplified sounds to the ear canals. There are ongoing efforts to reduce the size of hearing devices. However, the large power source and power management circuit components of a hearing device complicate these efforts.

SUMMARY

According to some embodiments, an ear-worn electronic device comprises a shell and one or more electrical components in or on the shell. The electrical components in or on the shell can comprise one or more capacitors, one or more resistors, or a combination of capacitors and resistors.

In accordance with some embodiments, an ear-worn electronic device comprises a shell defining an enclosure of the device. Electronics are disposed within a void in the enclosure. The device comprises one or more capacitors on or within the shell and coupled to the electronics. The one or more capacitors can be supercapacitors, such as fiber supercapacitors.

According to other embodiments, an ear-worn electronic device comprises a shell defining an enclosure of the device, and electronics disposed within a void of the enclosure. The device comprises one or more capacitors on or within the shell and coupled to the electronics. The one or more capacitors are part of a circuit of the electronics that provides power management for the ear-worn electronic device. The one or more capacitors can be supercapacitors, such as fiber supercapacitors.

The above summary is not intended to describe each disclosed embodiment or every implementation of the present disclosure. The figures and the detailed description below more particularly exemplify illustrative embodiments.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

It is understood that the embodiments described herein may be used with any ear-worn electronic device without departing from the scope of this disclosure. The devices depicted in the figures are intended to demonstrate the subject matter, but not in a limited, exhaustive, or exclusive sense. It is also understood that the present subject matter can be used with a device designed for use in or on the right ear or the left ear or both ears of the wearer.

The term ear-worn electronic device of the present disclosure refers to a wide variety of ear-level electronic devices that can aid a person with impaired hearing. The term ear-worn electronic device also refers to a wide variety of devices that can produce optimized or processed sound for persons with normal hearing. Ear-worn electronic devices of the present disclosure include hearables (e.g., wearable earphones, headphones, earbuds, virtual reality headsets), hearing aids (e.g., hearing instruments), cochlear implants, and bone-conduction devices, for example. Ear-worn electronic devices include, but are not limited to, behind-the-ear (BTE), in-the-ear (ITE), in-the-canal (ITC), invisible-in-canal (IIC), receiver-in-canal (RIC), receiver-in-the-ear (RITE) or completely-in-the-canal (CIC) type hearing devices or some combination of the above. Throughout this disclosure, reference is made to an "ear-worn electronic device," which is understood to refer to a system comprising a left ear device or a right ear device or a combination of a left ear device and a right ear device.

The present inventor has recognized, among other things, that a problem to be solved includes decreasing the size of the power management electronics in ear-worn electronic devices. A particular problem to be solved includes decreasing the size of the RC circuit footprint in ear-worn electronic devices, as well as increasing the potential capacitance of RC circuits in ear-worn electronic devices. The present solution addresses these problems by incorporating one or more capacitors, alone or in combination with one or more resistors, in the shell of an ear-worn electronic device. The present solution also addresses these problems by proposing the use of fiber capacitors and resistors (traditional or fiber resistors) to create an RC circuit in the shell of an ear-worn electronic device, thereby eliminating the need for a separate RC circuit on the circuit board that is positioned in the void within the ear-worn electronic device, thereby decreasing the required size of the ear-worn electronic device and increasing the potential capacitance available from the RC circuit in a small footprint. The present solution offers even further advantage in providing power storage directly in the shell of the ear-worn electronic device using one or more supercapacitors (without the need for a discrete power storage element such as a battery housed inside of the hollow shell).

When building ear-worn electronic devices, size is a significant concern. For example, end users often times prefer to use a hearing aid with as small of a form factor as possible so that it is less visible when being worn. The inventor has recognized that reducing the number of passive components on the circuit board of the ear-worn electronic device would be valuable. There are also limitations on the capacitance values of most existing capacitors presently commercially available that are of a small enough form factor to fit within an ear-worn electronic device. The present disclosure relates to an ear-worn electronic device that includes one or more capacitors (e.g., supercapacitors) integrated into, and in part make up, the shell of the ear-worn electronic device. The present description further relates to an ear-worn electronic device that includes one or more capacitors (e.g., supercapacitors) and resistors arranged in an RC circuit, such that the RC circuit is integrated into, and in part makes up, the shell of the ear-worn electronic device.

Figure 1:
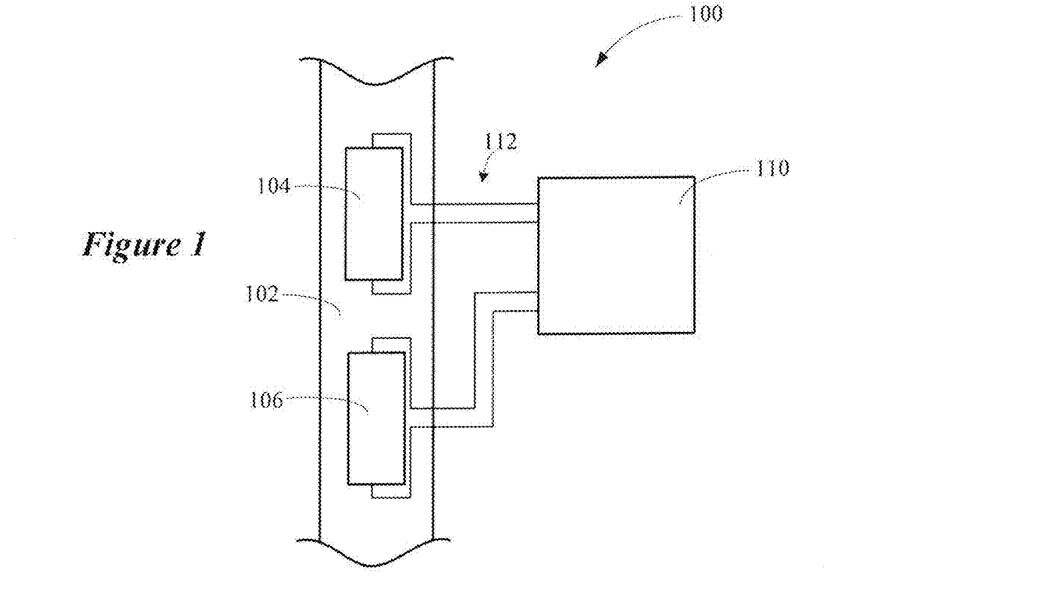
FIG. 1 shows a portion of an ear-worn electronic device having a shell that incorporates one or more capacitors in accordance with various embodiments.

FIG. 1 shows a portion of an ear-worn electronic device having a shell that incorporates one or more capacitors in accordance with various embodiments. The portion of the ear-worn electronic device 100 shown in FIG. 1 includes a portion (e.g., a side panel) of the shell 102 which encompasses the various components of the ear-worn electronic device 100. The term shell as used herein refers to the enclosure, housing, or case of the ear-worn electronic device 100. For example, a shell defines an enclosure of the ear-worn electronic device, and this enclosure includes a void within which components (e.g., circuit board, electronics, battery) of the ear-worn electronic device are situated. As is shown in FIG. 1, electronics 110 of the ear-worn electronic device 100 are contained within a void of the shell 102. The electronics 110 are typically mounted to a circuit board, such as a flexible mother circuit situated within the void of the shell 102.

As is shown in FIG. 1, one or more capacitors 104 and 106 are disposed on or in the shell 102 (e.g., integrated within or supported by the shell wall). The capacitors 104 and 106 can act as traditional capacitors or be supercapacitors. In some embodiments, the one or more capacitors 104 and 106 are integral to, and in part make up, the shell 102. For example, the capacitors 104 and 106 can be fiber capacitors, such as fiber supercapacitors, that define structural portions of the shell 102. In some embodiments, the one or more capacitors 104 and 106 are of a conventional type (e.g., aluminum electrolytic or tantalum electrolytic). In an alternative configuration, the one or more capacitors 104 and 106 are supported on or by an interior wall of the shell 102.

In the embodiment shown in FIG. 1, the capacitors 104 and 106 are electrically coupled to the electronics 110 via an electrical conductor arrangement 112. The electrical conductor arrangement 112 can include wires (e.g., insulated wires) or flexible connectors (e.g., flex cables). In some embodiments, a plastic member comprising a patterned metallization layer (e.g., traces formed using laser direct structuring) can extend between the shell 102 and the electronics 110 to connect with the capacitors 104 and 106. It is understood that any number of capacitors can be disposed in or on the shell 102 and coupled to the electronics 110. It is also understood that electrical conductors of the electrical conductor arrangement 112 can extend through the shell 102 and terminate at a common location, and that a single flexible connector (multiple independent conductors) can extend between the electronics 110 and the shell 102 for connecting with the capacitors 104 and 106.

Figure 2:
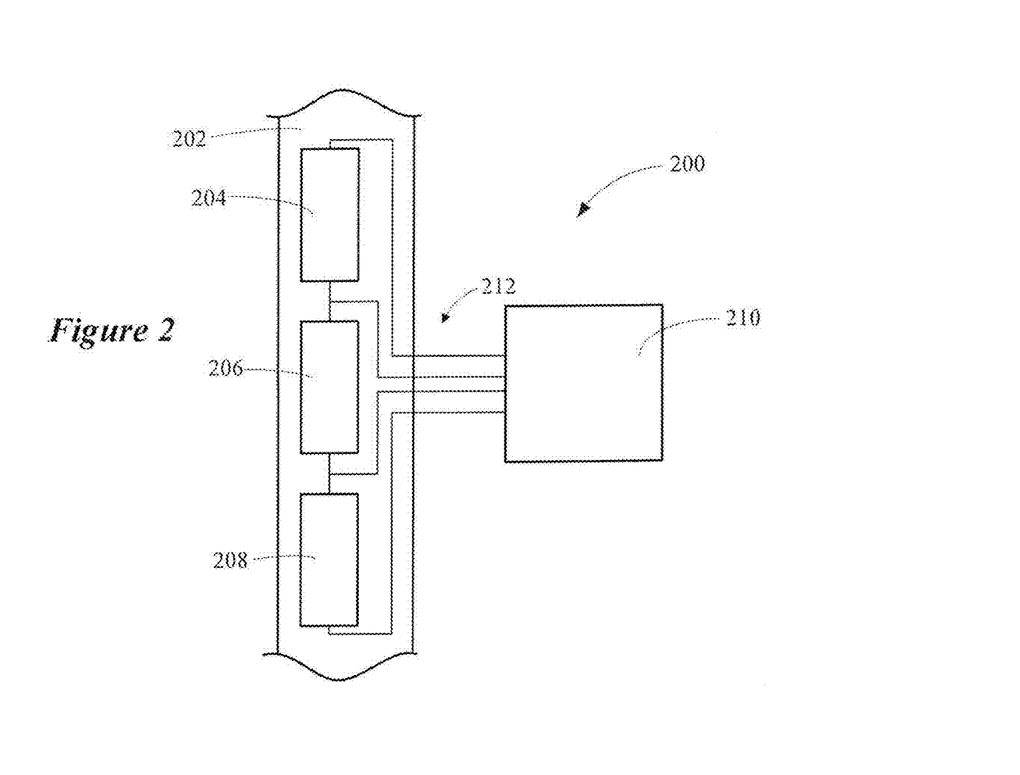
FIG. 2 shows a portion of an ear-worn electronic device having a shell that incorporates components of an RC circuit in accordance with various embodiments.

FIG. 2 shows a portion of an ear-worn electronic device having a shell that incorporates components of an RC circuit in accordance with various embodiments. In the embodiment shown in FIG. 2, the shell 202 incorporates or supports a capacitor 204, a capacitor 208, and a resistor 206. The capacitors 204, 208 and the resistor 206 are connected via an electrical conductor arrangement 212 to form an RC circuit within or on the shell 202. The electrical conductor arrangement 212 electrically connects the capacitors 204, 208 and the resistor 206 to electronics 210 within the shell 202. The capacitors 204, 208, the resistor 206, and the electrical conductor arrangement 212 can be configured to form an RC circuit such as that shown in FIG. 9, for example. Additional components can be integrated into or on the shell 202 to form an RC circuit such as that shown in FIG. 10, for example.

According to some embodiments, the capacitors 204, 208 are fiber capacitors, such as fiber supercapacitors, and the resistor 206 is a conventional resistor (e.g., carbon film, metal film, wirewound, surface mount). In other embodiments, the capacitors 204, 208 are fiber capacitors, such as fiber supercapacitors, and the resistor 206 is a fiber resistor. A multiplicity of fiber capacitors 204, 208 (e.g., supercapacitors) and resistors 206 (conventional or fiber) can be incorporated within or on the shell 202 to form a multiplicity of RC circuits. The RC circuit or circuits can be components of the power management circuitry of the electronics 210.

Figure 3:
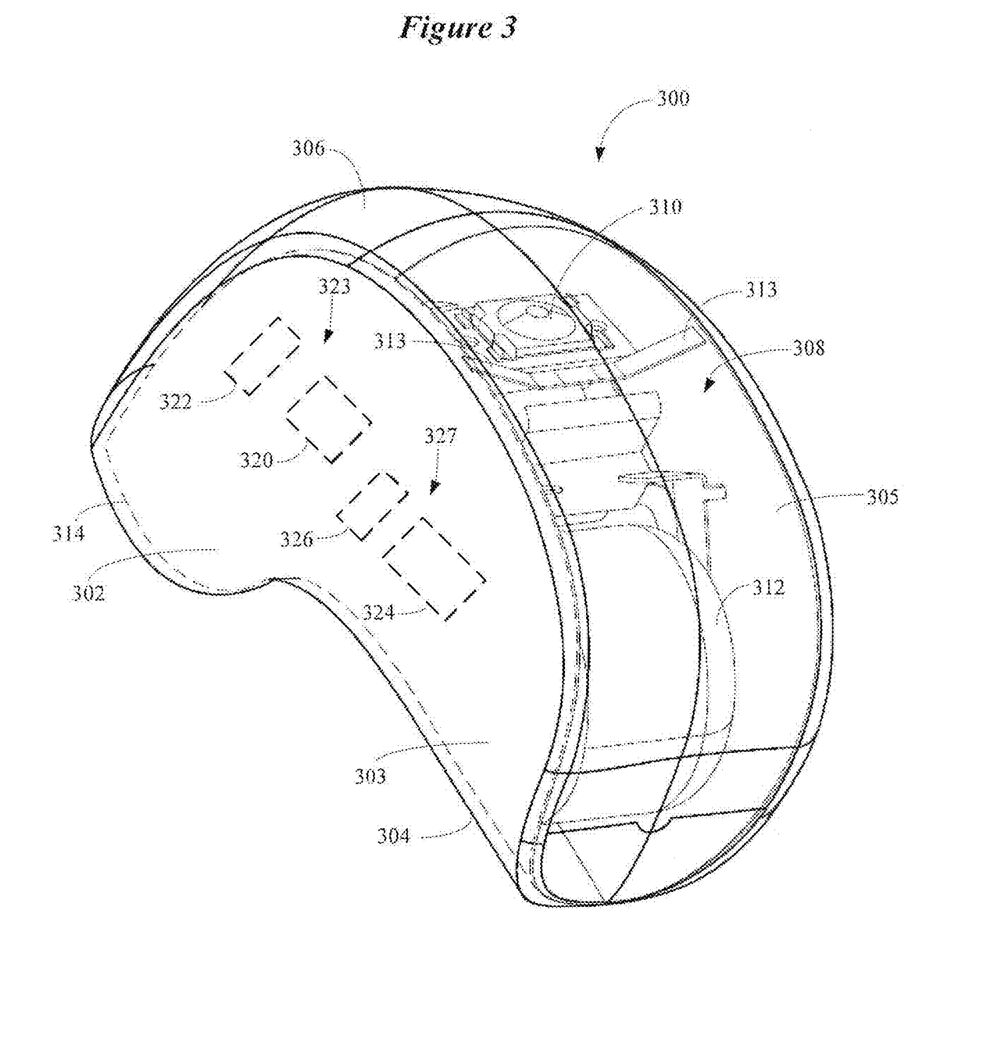
FIG. 3 illustrates an ear-worn electronic device that includes a shell incorporating or supporting one or more electronic components in accordance with various embodiments.

FIG. 3 illustrates an ear-worn electronic device that includes a shell incorporating or supporting one or more capacitors in accordance with various embodiments. In the embodiment shown in FIG. 3, the ear-worn electronic device 300 is of a behind-the-ear (BTE) design. The ear-worn electronic device 300 includes a shell 302 which includes a first side 303, an opposing second side 305, a bottom 304, and a top 306. A portion 308 of the top 306 is removed in FIG. 3 to show components housed within the shell 302. The internal components of the ear-worn electronic device 300 include electronics 310 coupled to a battery 312. In some embodiments, the battery 312 can be eliminated by provision of supercapacitors in or on the shell 302 that serve as a rechargeable primary power source for the ear-worn electronic device 300. According to some embodiments, the ear-worn electronic device 300 includes an antenna 314 which is coupled to a radio (e.g., 2.4 GHz radio) of the electronics 310 via feed line conductors 313.

FIG. 3 shows a number of electrical components incorporated within or supported by the shell 302 of the ear-worn electronic device 300. As shown, four electronic components are incorporated within or supported by the first side 303 of the shell 302. An equal or different number of electrical components can be incorporated within or supported by the second side 305 of the shell 302. It is understood that one or more electrical components can be incorporated within or supported by the bottom 304 or top 306 of the shell 302.

According to a non-limiting illustrative example, the electrical components incorporated within or supported by the second side 305 of the shell 302 include capacitors 320 and 324 and resistors 322 and 326. The capacitors 320 and 324 can act as traditional capacitors or be supercapacitors. The capacitor 320 and resistor 322 form a first RC circuit 323, and the capacitor 324 and resistor 326 form a second RC circuit 327. The first and second RC circuits 323 and 327 are electrically coupled to the electronics 310 via respective electrical conductors. In an embodiment which includes the antenna 314, the electrical conductors can pass through apertures provided in the antenna 314. It is understood that the first and second RC circuits 323 and 327 can include any number of capacitors and resistors, and that the capacitors and resistors can be fiber or conventional capacitors and resistors. The first and second RC circuit 323 and 327 can be components of power management circuitry of the electronics 310. In some embodiments, the capacitors 320 and 324 are supercapacitors (e.g., fiber supercapacitors) configured to serve as a primary rechargeable power source for the ear-worn electronic device 300, thereby eliminating the bulky battery 312 from the device 300.

Figure 4:
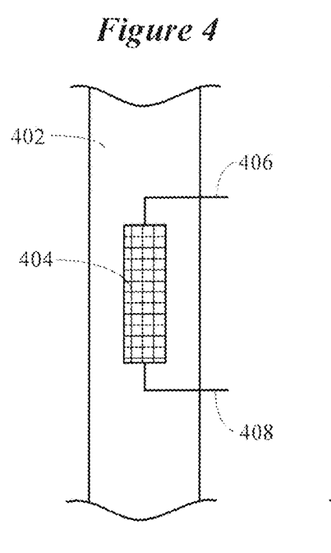
FIG. 4 shows a capacitor incorporated within a shell of an ear-worn electronic device in accordance with various embodiments.

FIG. 4 shows a capacitor incorporated within a shell of an ear-worn electronic device in accordance with various embodiments. In the embodiment shown in FIG. 4, the entirety of the capacitor 404 is incorporated within the shell 402. According to some embodiments, the capacitor 404 is encapsulated in a protective material, such as a resin or an epoxy. The protective material can rigidize the capacitor 404. The capacitor 404 can be incorporated as a component of the shell 402 during a molding process used to fabricate the plastic or composite shell 402. Electrical conductors 406 and 408 are connected to the capacitor 404 and extend into the void within the shell 402 for coupling to the electronics of the ear-worn electronic device. The capacitor 404 can be a fiber capacitor, such as a fiber supercapacitor.

Figures 5, 6:
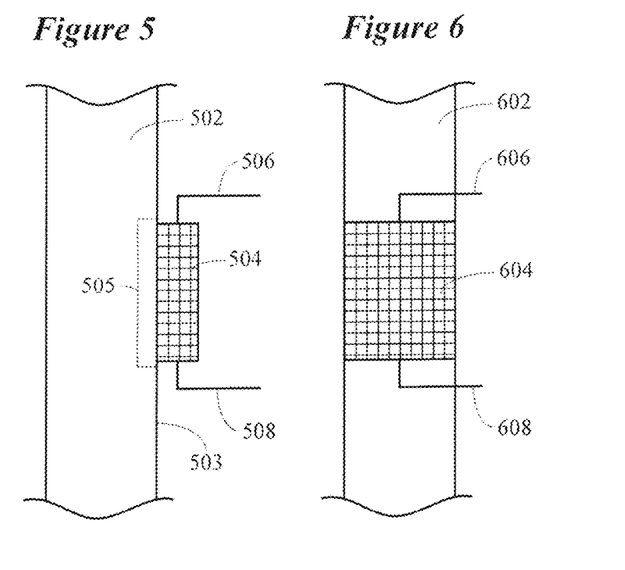
FIG. 5 shows a capacitor supported by a shell of an ear-worn electronic device in accordance with various embodiments.
FIG. 6 shows a capacitor integrated into, and in part making up, the shell of an ear-worn electronic device in accordance with various embodiments.

FIG. 5 shows a capacitor supported by a shell of an ear-worn electronic device in accordance with various embodiments. In the embodiment shown in FIG. 5, the capacitor 504 is mounted to an interior wall 503 of the shell 502. In some embodiments, the capacitor 504 can be affixed to the interior wall 503 via an adhesive. The capacitor 504 can be encapsulated in a protective material, such as a resin or an epoxy. Electrical conductors 506 and 508 extend into the void within the shell 502 for coupling to the electronics of the ear-worn electronic device. It is noted that the capacitor 504 can be installed within a recess 505 (optional) within the shell 502 dimensioned to receive at least a portion of the capacitor 504 The capacitor 504 can be a fiber capacitor, such as a fiber supercapacitor.

FIG. 6 shows a capacitor integrated into, and in part making up, the shell of an ear-worn electronic device in accordance with various embodiments. In the embodiment shown in FIG. 6, the capacitor 604 defines a structural portion of the shell 602. More particularly, the capacitor 604 is an integral portion of the shell 602 that mechanically cooperates with shell material to provide mechanical integrity of the shell 602. The capacitor 604 may be covered with, or encapsulated in, a protective resin or epoxy which rigidizes the capacitor 604. The capacitor 604 can be incorporated as a component of the shell 602 during a molding process used to fabricate the plastic or composite shell 602. The rigidized capacitor 604 serves as a structural section of the shell 602. Electrical conductors 606 and 608 extend into the void within the shell 602 for coupling to the electronics of the ear-worn electronic device. The capacitor 604 can be a fiber capacitor, such as a fiber supercapacitor.

Figure 7:
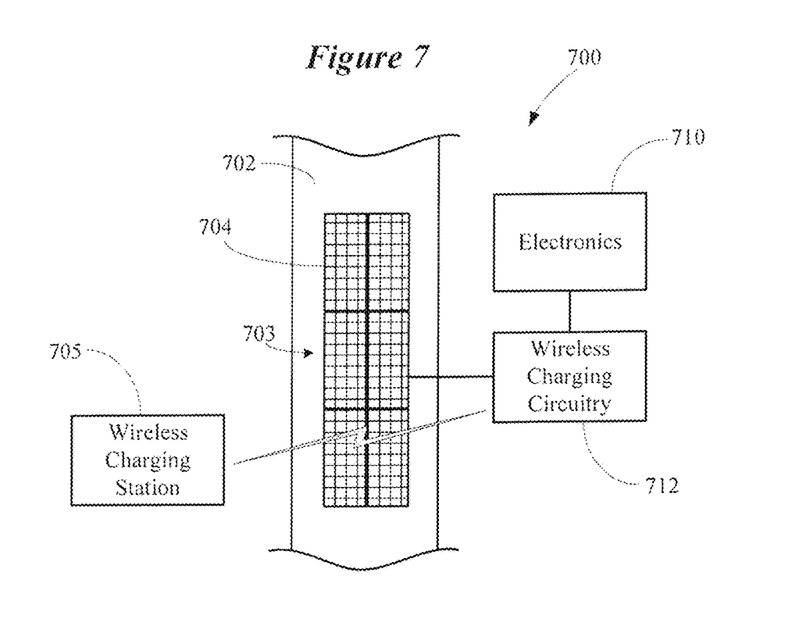
FIG. 7 shows a number of supercapacitors integrated into the shell of an ear-worn electronic device in accordance with various embodiments.

FIG. 7 shows a number of supercapacitors integrated into the shell of an ear-worn electronic device in accordance with various embodiments. In the embodiment shown in FIG. 7, a number of supercapacitors 704 are electrically connected together (e.g., in parallel) to form a rechargeable primary power source 703 for the ear-worn electronic device 700. In FIG. 7, six supercapacitors 704 are shown connected together for illustrative purposes. It is understood that the number of supercapacitors 704 and primary power sources 703 integrated into the shell 702 will vary depending on the power requirements of the ear-worn electronic device 700. The supercapacitor 704 can be a traditional or fiber supercapacitor.

As is further shown in FIG. 7, the electronics 710 are coupled to or incorporate wireless charging circuitry 712. The wireless charging circuitry 712 is configured to cooperate with an external wireless charging station 705 to wirelessly charge the supercapacitors 704 of the primary power source 703. According to some embodiments, the wireless charging station 705 uses an induction coil to create an alternating electromagnetic field which is transmitted to the wireless charging circuitry 712 within the ear-worn electronic device 700. In response to the electromagnetic field, current is induced in an induction coil within the wireless charging circuitry 712 which charges the supercapacitors 704. According to some embodiments, the wireless charging circuitry 712 and wireless charging station 705 are configured to implement inductive charging in accordance with the Qi open interface standard developed by the Wireless Power Consortium.

Figure 8:
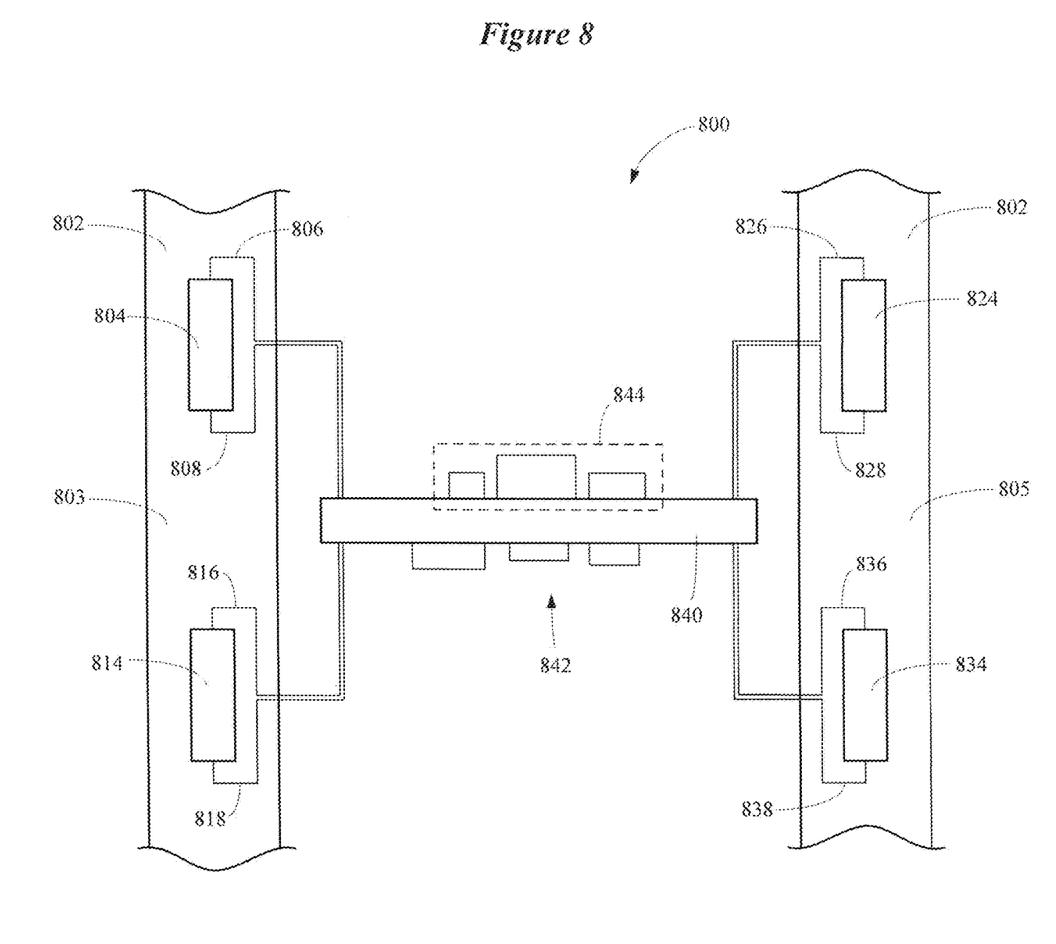
FIG. 8 shows a portion of an ear-worn electronic device having a shell that incorporates capacitors in accordance with various embodiments.

FIG. 8 shows a portion of an ear-worn electronic device having a shell that incorporates capacitors in accordance with various embodiments. In the embodiment shown in FIG. 8, the ear-worn electronic device 800 includes a shell 802 that houses various components including electronics 842. The electronics 842 are mounted on a circuit board 840, which may be a flexible circuit board. Among other functional circuits, the electronics 842 includes power management circuitry 844. In addition to components mounted on the circuit board 840, the power management circuitry 844 includes passive electrical components 804, 814, 824, and 834 incorporated within or supported by the shell 802. For example, the components 804, 814, 824, and 834 can be incorporated within or supported by the shell 802 in a manner shown in FIGS. 4-6. One or more of the components 804, 814, 824, and 834 includes a capacitor (conventional or fiber), which may be a supercapacitor. In some embodiments, the components 804, 814, 824, and 834 include capacitors (e.g., supercapacitors) and resistors, which may be connected to form RC circuits of the power management circuitry 844.

According to some embodiments, the component 804 is a supercapacitor electrically coupled to the power management circuitry 844 via electrical conductors 806 and 808. The component 814 is a resistor electrically coupled to the power management circuitry 844 via electrical conductors 816 and 818. The supercapacitor 804 and resistor 814 can be incorporated within or supported by a first side panel 803 of the shell 802. The component 824 is a supercapacitor electrically coupled to the power management circuitry 844 via electrical conductors 826 and 828. The component 834 is a resistor electrically coupled to the power management circuitry 844 via electrical conductors 836 and 838. The supercapacitor 824 and resistor 834 can be incorporated within or supported by a second side panel 805 of the shell 802, where the first and second side panels 803 and 805 are opposing sidewalls of the shell 802. Although four components 804, 814, 824, and 834 are shown in FIG. 8 for illustrative purposes, any number of components (e.g., capacitors/supercapacitors or combinations of capacitors/supercapacitors and resistors) can be incorporated within or on the shell 802.

The electrical conductors 806, 808, 816, 818, 826, 828, 836, and 838 can be wires (e.g., insulated wires) or flexible connectors (e.g., flex cables). As was discussed previously, in some embodiments, plastic members comprising a patterned metallization layer defining conductive traces can be used to electrically connect the components 804, 814, 824, and 834 with the power management circuitry 844. For purposes of illustration, any of the components 804, 814, 824, and 834 shown in FIG. 8 can correspond to the capacitors and resistors shown in FIGS. 9 and 10.

In the embodiments discussed above, the capacitors and supercapacitors incorporated within or supported by the shell of the ear-worn electronic device can be implemented as conventional or fiber capacitors and supercapacitors. In general terms, a fiber capacitor or supercapacitor comprises carbon fibers, such as carbon microfibers, carbon nanotubes, carbon nanofibers, graphene fibers, carbon composite fibers or a combination thereof. The resistors incorporated within or supported by the shell can be implemented as conventional or fiber resistors. Suitable fiber resistors include those disclosed in U.S. Pat. No. 6,507,271 (carbon fiber resistor) and U.S. Pat. No. 8,101,529 (carbon nanotube resistor), and in U.S. Patent Publication No. 2013/0002395 (polymer fiber-based resistor), each of which is incorporated herein by reference.

In some embodiments, the fiber capacitors and fiber supercapacitors are implemented as coaxial fiber capacitors comprising one or more coaxial fiber elements. In other embodiments, the fiber capacitors and fiber supercapacitors are implemented as multiple-ply (e.g., 2-ply) capacitors. In some embodiments, the fiber capacitors and fiber supercapacitors comprise a weave of fiber elements. In other embodiments, the fiber capacitors and fiber supercapacitors comprise stacked fiber elements. In further embodiments, the fiber capacitors and fiber supercapacitors comprise nanofibers. Details of these and other implementations are provided hereinbelow.

Coaxial and multiple-ply fiber materials can be used as both capacitors and as resistive elements. These capacitors and/or resistors can be used as power management filters of an ear-worn electronic device. These power management filters can, in part, be used to keep the noise on the power supply in one part of the RC circuit from affecting the signals in another part of the RC circuit. For example, in current hearing aids, the radio may draw current that occasionally spikes and creates noise on the power supply for the remaining elements that draw power from the battery. In the presently described solution, the current spikes drawn by the radio would be supplied by one fiber capacitor (e.g., a fiber supercapacitor), and the remaining elements could utilize a different fiber capacitor (e.g., a fiber supercapacitor) to prevent the current spike from influencing their local voltage, and thus be relatively isolated from noise on the power supply.

Figure 9:
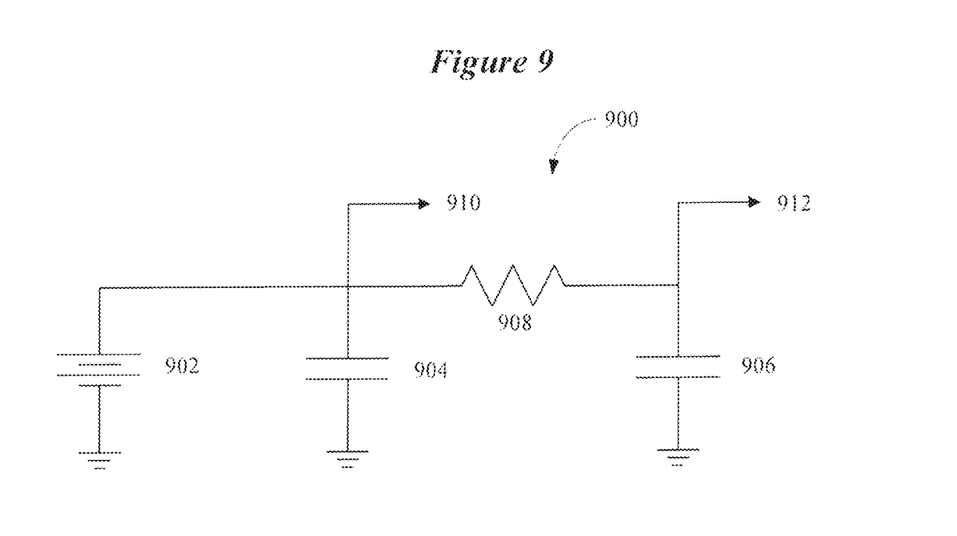
FIG. 9 shows power management circuitry comprising components that can be incorporated within or supported by the shell of an ear-worn electronic device in accordance with various embodiments.

FIG. 9 shows power management circuitry 900 comprising components that can be incorporated within or supported by the shell of an ear-worn electronic device in accordance with various embodiments. The circuit 900 may include a conventional power source 902, such as a battery. The circuit 900 includes two capacitors 904 and 906 and a resistor 908. At least the capacitors 904 and 906 are implemented as supercapacitors and incorporated within or supported by the shell of the ear-worn electronic device. For example, the two supercapacitors 904 and 906 can be implemented as rigid elements made of stacked coaxial fiber material. The resistor 908, which can be a conventional resistor or a fiber resistor (e.g., made of stacked coaxial fiber material or multi-ply fiber material), is also a rigid element that can be incorporated within or supported by the shell of the ear-worn electronic device.

According to some embodiments, the circuit 900 includes a first coaxial fiber element 904 which, in the presently illustrated example, is a first capacitor. The circuit 900 also includes a second coaxial fiber element 906 which, in the present example, is a second capacitor. Circuit 900 additionally includes a third coaxial fiber element 908, which in the present example, is a resistor. In some embodiments, the first and second fiber capacitors 904 and 906 act as conventional capacitors. The resistor 908 can be a conventional or fiber resistor. In other embodiments, the first and second fiber capacitors 904 and 906 are supercapacitors.

Multiple elements of the ear-worn electronic device may draw power from circuit 900. For example, element 910 may primarily draw power from power source 902. However, in the event of a large current draw by element 910, instantaneous current may also be provided to element 910 by first supercapacitor 904. Second element 912 may also presumptively draw current from power source 902. However, in given circumstances, second element 912 may draw power from discharge of second supercapacitor 906. For example, where first element 910 is drawing excessive current from power source 902, first element 910 may also draw current from first supercapacitor 904, and second element 912 may draw current from second supercapacitor 906. The circuit 900 may effectively act as a power management filter.

The presence of resistor 908 between the first current drawing element 910 and second current drawing element 912, and also the presence of a supercapacitor (904, 906) that is associated with each current drawing element 910, 912, provides at least some measure of isolation between the two power supplying nodes. Further, increasing the resistance value of resistor 908 and/or the capacitance values of supercapacitors 904 and 906 will further increase the isolation between the two nodes.

Figure 10:
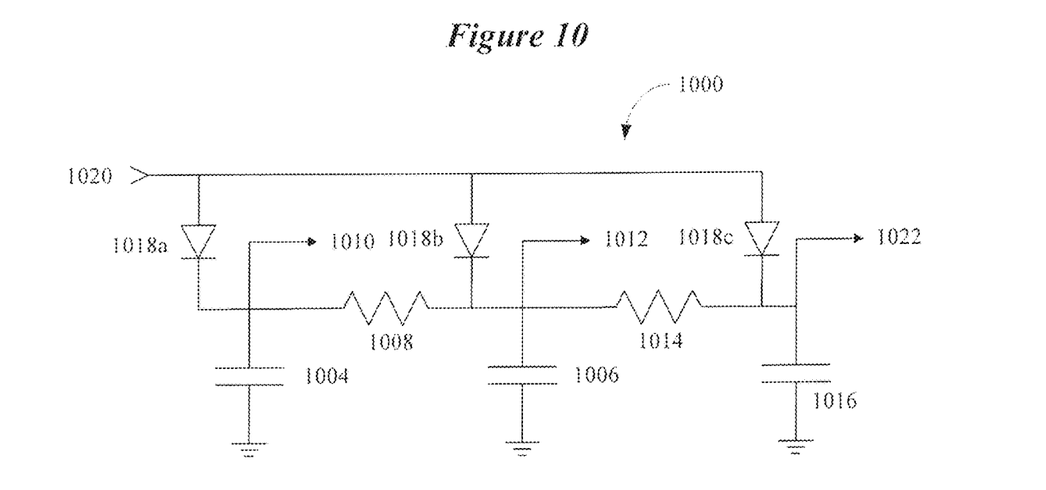
FIG. 10 shows power management circuitry comprising components that can be incorporated within or supported by the shell of an ear-worn electronic device in accordance with various embodiments.

Another embodiment of the present description is illustrated in FIG. 10. FIG. 10 shows power management circuitry 1000 comprising components that can be incorporated within or supported by the shell of an ear-worn electronic device in accordance with various embodiments. In the embodiment shown in FIG. 10, the power management circuitry 1000 includes one or more supercapacitors that serve as a rechargeable primary power source for an ear-worn electronic device. As such, a conventional power source, such as a battery, can be excluded from the ear-worn electronic device.

According to some embodiments, circuit 1000 of FIG. 10 includes a first coaxial fiber element 1004 that is a capacitor, a second coaxial fiber element 1006 that is a capacitor, and a third coaxial fiber element 1008 that is a resistor. Circuit 1000 further includes fourth and fifth coaxial fiber elements 1014 and 1016 that are a resistor and capacitor, respectively. In the present example, one or more of the stacked coaxial fiber capacitors 1004, 1006, and 1016 of circuit 1000 are supercapacitors. For example, each of the capacitors 1004, 1006, and 1016 can be implemented as supercapacitors. Supercapacitors 1004, 1006, and 1016 are capable of holding a large amount of potential and may in effect act as a rechargeable battery. Because of this, in the present example, one or more of the supercapacitors 1004, 1006, and 1016 will act as a primary power source for power-drawing elements 1010, 1012 and 1022 of the ear-worn electronic device. Although described as coaxial fiber elements in FIG. 10, it is understood that other types of fiber elements (e.g., multi-ply) can be used as supercapacitors 1004, 1006, and 1016. In some embodiments, the supercapacitors 1004, 1006, and 1016 are conventional supercapacitors (e.g., double-layer capacitors, pseudocapacitors). Also, the resistors 1008 and 1014 can be conventional resistors or fiber resistors.

According to some configurations, the capacitors 1004, 1006, and 1016 are implemented as fiber supercapacitors that are incorporated within or supported by the shell of the ear-worn electronic device. For example, the fiber supercapacitors 1004, 1006, and 1016 can be rigidized using an encapsulating material, such as a resin or an epoxy, and incorporated into the plastic or composite material that forms the shell. In some configurations, the resistors 1008 and 1014 can also be incorporated within or supported by the shell of the ear-worn electronic device, with appropriate encapsulating material applied thereto to rigidize the resistors 1008 and 1014. Alternatively, the resistors 1008 and 1014 can be mounted on a circuit board within the void of the shell.

When the potential of each of the supercapacitors 1004, 1006, and 1016 has been partially or fully discharged, the supercapacitors 1004, 1006, and 1016 are capable of being recharged by applying a voltage at point 1020 to the circuit 1000. The resistors 1008 and 1014 help ensure that the supercapacitors 1004, 1006, and 1016 in circuit 1000 all maintain comparable voltage in periods when the supercapacitors 1004, 1006, and 1016 are not being charged. Diodes 1018a, 1018b, and 1018c ensure that current from the recharging voltage source flows to the supercapacitors 1004, 1006, and 1016 but current from the fiber supercapacitors 1004, 1006, and 1016 can only flow to elements 1010, 1012, and 1022 and not be pulled from the circuit 1000 by an external source. Though illustrated with multiple elements acting as sources of power supply, it should be understood that the circuit 1000 may include only one supercapacitor (e.g. element 1004), two supercapacitors (e.g., elements 1004 and 1006), or may also include more than three supercapacitors.

In FIGS. 9 and 10, the electrical components are illustrated as part of a common circuit. However, it should be understood that the shell of an ear-worn electronic device may in fact include at least two discrete circuits, each of which may include fiber elements. These discrete circuits may, in some examples, be capable of communicating information with one another. However, in some examples, the two discrete circuits will not share power with one another. The discrete circuits may be positioned on different panels that form part of the shell of an ear-worn electronic device.

According to the embodiments discussed hereinabove, capacitors integrated into or supported by the shell of an ear-worn electronic device can be implemented as fiber capacitors, such as fiber supercapacitors. As was previously discussed, the fiber capacitors can be implemented as coaxial fiber capacitors or multiple-ply capacitors. In some embodiments, the fiber capacitors comprise a weave (e.g., fabric) of fiber elements. In other embodiments, the fiber capacitors comprise stacked fiber elements. In further embodiments, the fiber capacitors comprise nanofibers. In each of these embodiments, a fiber capacitor can be encapsulated or otherwise covered by a protective material (e.g., resin or epoxy), which may rigidize the fiber capacitor. In some embodiments, a pliable (e.g., flexible) fiber capacitor can be molded into a plastic or composite shell of an ear-worn electronic device, such that the plastic or composite material in contact with the fiber capacitor provides the desired rigidity.

In some embodiments, coaxial fiber supercapacitors may be made, at least in part, of carbon nanotubes (see, e.g., "Coaxial Fiber Capacitor Using All-Carbon Material Electrodes" *ACS Nano*, 201, 7 (7), pp 5940-5947, Viet Thong Le, et. al.). The nanotubes can be fabricated as a weave and rigidized using an encapsulating or impregnating material. It is understood that stacking instead of weaving nanotubes can create rigid structures (see, e.g., http://phys.org/news/2006-05-nanotube-sandwiches-composite-materials.html).

The present inventor has recognized that where such coaxial fiber supercapacitors are stacked to create a rigid structure, they can create a greater rigid structure (such as a shell or case of an ear-worn electronic device), and the coaxial fiber supercapacitors can be arranged as part of the shell or case to generate singular or multiple capacitors and/or resistors, as part of an RC circuit for example. These supercapacitors offer sufficient capacitance for the requirements of a conventional hearing device, while enabling a smaller total form factor than conventional capacitors. In fact, the supercapacitor materials are capable of holding greater capacitance than current capacitance technologies used in hearing aids, for example.

Figure 11:
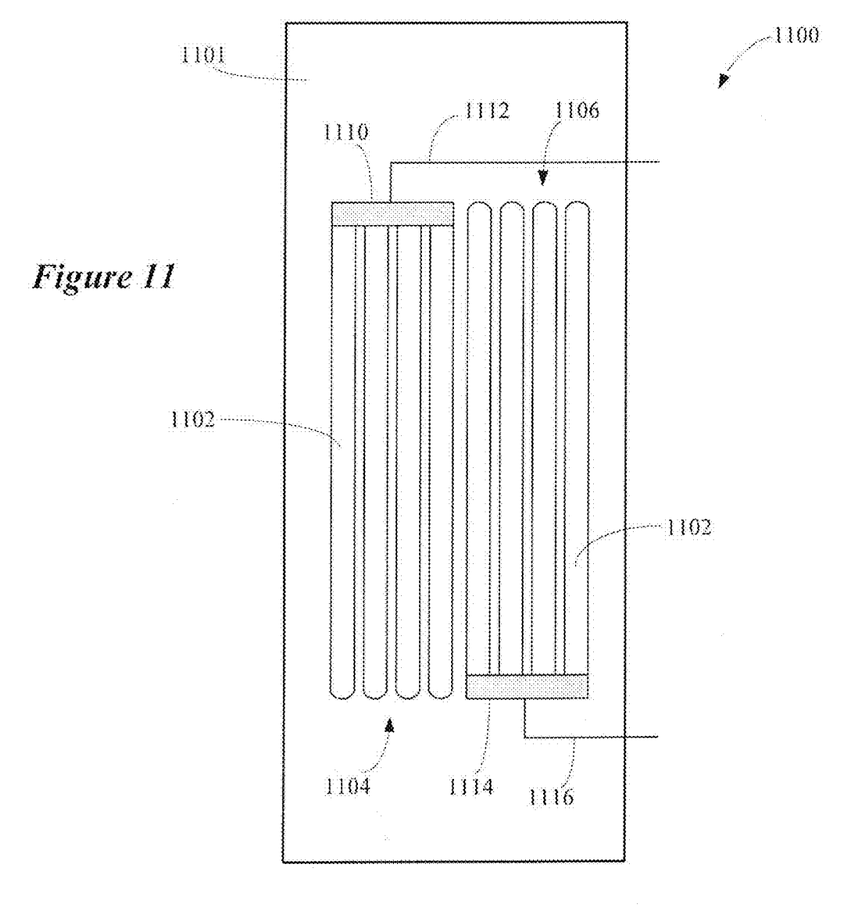
FIG. 11 shows a fiber supercapacitor that can be incorporated within or supported by a shell of an ear-worn electronic device in accordance with various embodiments.

FIG. 11 shows a fiber supercapacitor that can be incorporated within or supported by a shell of an ear-worn electronic device in accordance with various embodiments. The fiber supercapacitor 1100 shown in FIG. 11 includes a number of elongated fiber elements 1102 supported by a flexible substrate 1101 (e.g., a flexible polyester (PET) substrate). The fiber elements 1102 can be formed from carbon fibers, such as carbon nanotubes or graphene fibers. As shown, the fiber elements 1102 are arranged such that the longitudinal axes of the fiber elements 1102 are substantially parallel. A first set 1104 of the fiber elements 1102 is connected to a first electrode 1110, and a second set 1106 of the fiber elements 1102 is connected to a second electrode

1114. Connecting multiple fiber elements 1102 at common electrode 1110, 1116 is a form of stacking fiber elements 1102 together to form a supercapacitor 1100. The first and second fiber element sets 1104 and 1106 can be connected to circuitry of the electronics within the ear-worn electronic device via electrical conductors 1112 and 1116. It is understood that the supercapacitor 1100 shown in FIGS. 11 and 12 can comprise a single fiber element 1102 rather than a multiplicity of fiber elements 1102.

Figure 12:
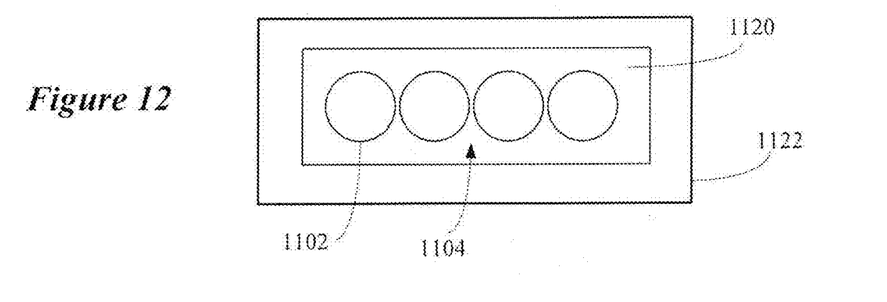
FIG. 12 shows a portion of the fiber supercapacitor illustrated in FIG. 11.

According to some embodiments, and as shown in FIG. 12, the fiber elements 1102 can be mounted onto the substrate 1101 using a solid-state electrolyte 1120. The solid-state electrolyte 1120 can be a gelled polymer electrolyte, such as an electrolyte comprising polyvinyl alcohol (PVA-$H_3PO_4$). Use of a solid-state electrolyte avoids the possible harmful leakage of a conventional liquid electrolyte, decreases device volume, and simplifies the fabrication process. The solid-state electrolyte 1120 wraps around each of the fiber elements 1102, serving as both an electrolyte and an effective separator to prevent any to undesirable short-circuit between the fiber elements 1102. The fiber supercapacitor 1100 can be encapsulated in a protective material 1122, such as a resin or an epoxy. The protective material 1122 can be a hard and strong material, allowing the fiber supercapacitor 1100 to be incorporated within, and in part make up, the shell of an ear-worn electronic device.

Figure 13:
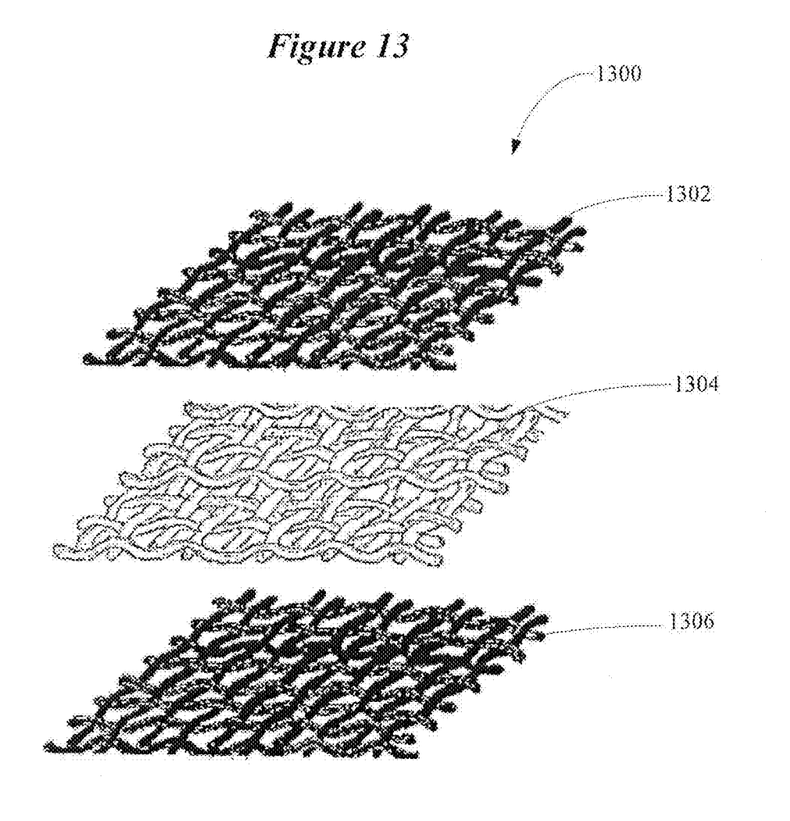
FIG. 13 shows a fiber supercapacitor that can be incorporated within or supported by a shell of an ear-worn electronic device in accordance with various embodiments.

FIG. 13 shows a fiber supercapacitor that can be incorporated within or supported by a shell of an ear-worn electronic device in accordance with various embodiments. The fiber supercapacitor 1300 shown in FIG. 13 includes a first fiber electrode 1302, a second fiber electrode 1306, and a separator 1304 disposed between the first and second fiber electrode 1302 and 1306. The first and second fiber electrodes 1302 and 1306 are encased in a resin which serves as an ion conductor. The first and second fiber electrodes 1302 and 1306 preferably comprise activated structural conducting fibers to form the electrodes in a woven form. In some embodiments, the first and second electrodes 1302 and 1306 can have a non-woven form. The separator 1304 serves as an insulator, and can be formed as a glass or polymer fiber mat structure. The glass or polymer fiber separator 1304 can be a woven structure.

The first and second fiber electrodes 1302 and 1306 can be formed from conductive nanofibers, such as carbon nanotubes or nanofibers. In some embodiments, the carbon nanotubes or nanofibers can be combined with conventional conducting fibers. The first and second fiber electrodes 1302 and 1306 can be formed of unidirectional, woven or NCF (nanotube continuous fibers) fibers, and can be fabricated using standard composite lamination techniques. Details of a suitable woven fiber supercapacitor are disclosed in U.S. Pat. No. 8,659,874, which is incorporated herein by reference.

Figure 14:
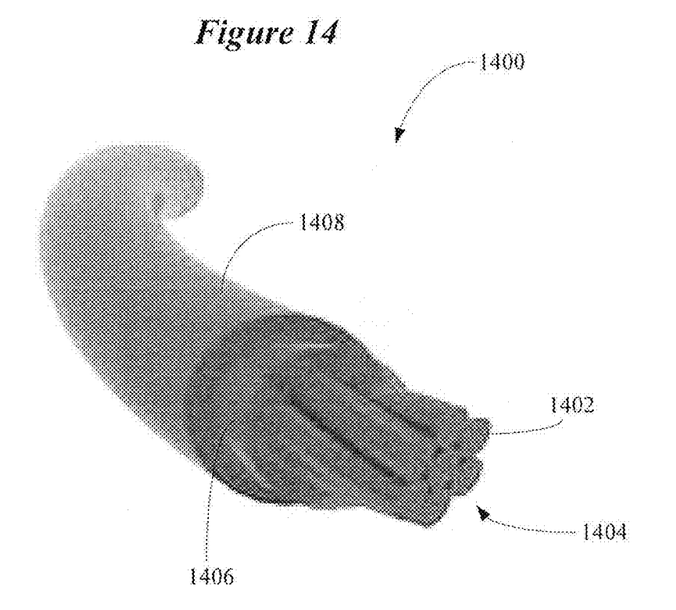
FIG. 14 shows a fiber supercapacitor that can be incorporated within or supported by a shell of an ear-worn electronic device in accordance with various embodiments.

FIG. 14 shows a fiber supercapacitor that can be incorporated within or supported by a shell of an ear-worn electronic device in accordance with various embodiments. The fiber supercapacitor 1400 shown in FIG. 14 is implemented as a coaxial fiber supercapacitor. The supercapacitor 1400 includes a number of carbon microfibers 1402 which are coated with multiwall carbon nanotubes. The coated microfibers 1402 are covered (typically by soaking) with a gelled polymer electrolyte (e.g., PVA-$H_3PO_4$). The coated carbon microfibers 1402 form a carbon microfiber bundle 1404 by wrapping the carbon microfibers 1402 with a separator 1406 (e.g., Celgard 3501). The carbon microfiber bundle 1404 defines a core electrode of the supercapacitor 1400. A carbon nanofiber film or paper 1408 is wrapped around the separator 1406 and defines an outer electrode of the supercapacitor 1400. One or more of the coaxial fiber supercapacitors 1400 (e.g., connected in series) can be incorporated within or supported by the shell of the ear-worn electronic device.

Figure 15:
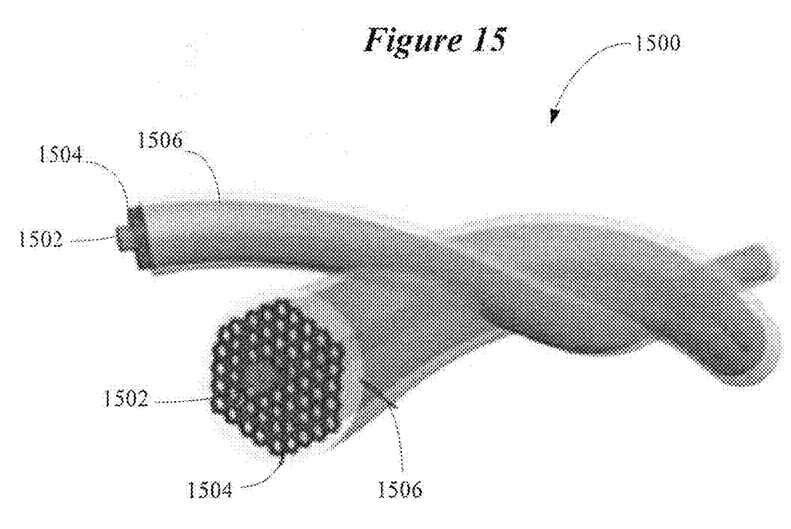
FIG. 15 shows a fiber supercapacitor that can be incorporated within or supported by a shell of an ear-worn electronic device in accordance with various embodiments.

FIG. 15 shows a fiber supercapacitor that can be incorporated within or supported by a shell of an ear-worn electronic device in accordance with various embodiments. The fiber supercapacitor 1500 shown in FIG. 15 is implemented as a two-ply fiber supercapacitor. The supercapacitor 1500 is fabricated from two twined graphene fiber/3D-graphene composite fibers with a polymer electrolyte. The supercapacitor 1500 includes a graphene fiber 1502 which is coated with porous 3D-graphene networks 1504 to define fiber electrodes, which are covered with a gelled polymer electrolyte (e.g., PVA-$H_3PO_4$). One or more of the two-ply fiber supercapacitors 1500 (e.g., connected in series) can be incorporated within or supported by the shell of the ear-worn electronic device.

The fiber supercapacitors shown in FIGS. 14 and 15 incorporate carbon-based fiber electrodes. An improvement in overall capacitance of a supercapacitor may be achieved by using pseudo-capacitive materials to obtain nanocomposite fiber electrodes. For example, a two-ply yarn-like supercapacitor can be fabricated using CNT/PANI (carbon nanotube/polyaniline) nanocomposite fibers as fiber electrodes with a gelled polymer electrolyte (e.g., PVA-$H_3PO_4$). Apart from PANI-based fiber electrodes, other kinds of conductive polymers can be utilized to fabricate composite fiber-based supercapacitors. For example, a biscrolled yarn-like super composite can be formed using a multiwalled nanotube/poly (3,4-ethylenedioxythiophene) (PEDOT) nanocomposite yarn and a platinum wire as to fiber electrodes with a gelled polymer electrolyte (e.g., PVA-$H_3PO_4$). Also, woven supercapacitor fabrics (which may be rigidized using a resin or epoxy) can be integrated into the shell of an ear-worn electronic device. An exemplary woven supercapacitor fabric has been developed by the Berkeley Sensor & Actuator Center (see project BPN 782 entitled "Flexible Load-Bearing Energy Storage Fabrics" at http://www-bsa-c.eecs.berkeley.edu/project/show_all_projects_table.php).

Figure 16:
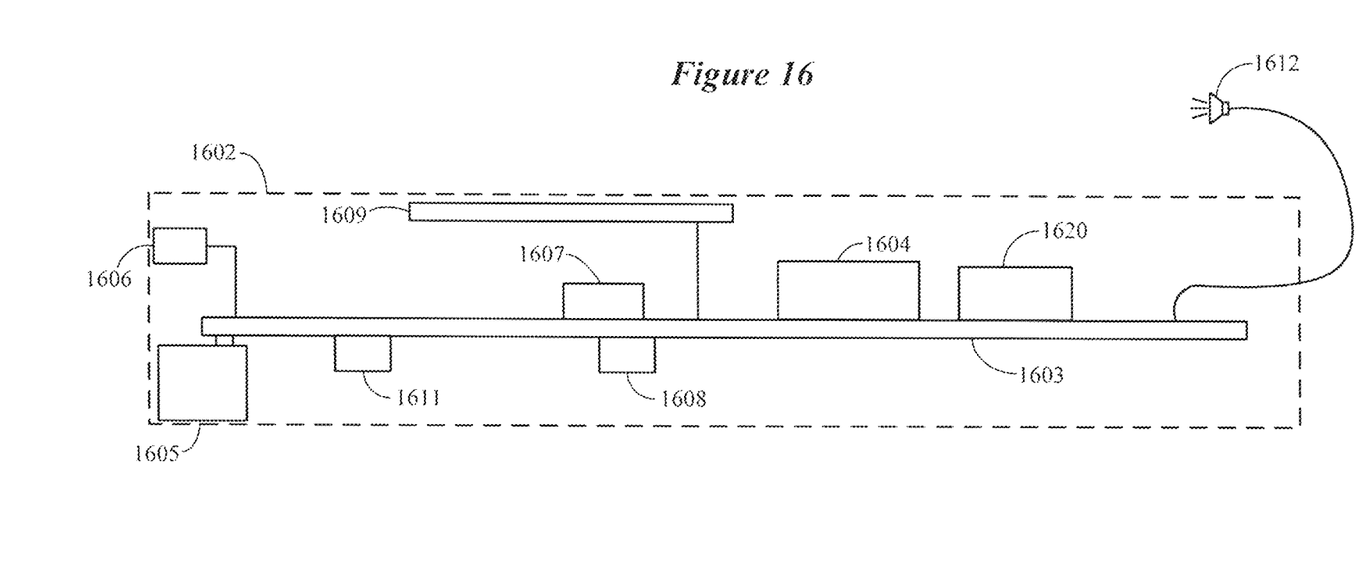
FIG. 16 is a block diagram showing various components that can be incorporated in an ear-worn electronic device in accordance with various embodiments.

FIG. 16 is a block diagram showing various components that can be incorporated in an ear-worn electronic device in accordance with various embodiments. The block diagram of FIG. 16 represents a generic ear-worn electronic device for purposes of illustration. Some of the components shown in FIG. 16 can be excluded and additional components can be included depending on the design of the ear-worn electronic device.

The ear-worn electronic device 1602 includes several components electrically connected to a mother flexible circuit 1603. A battery 1605 is electrically connected to the mother flexible circuit 1603 and provides power to the various components of the ear-worn electronic device 1602. As discussed previously, the battery 1605 can be excluded in some embodiments. Power management circuitry 1611 is coupled to the mother flexible circuit 1603, and is coupled to one or more capacitors or supercapacitors (and one or more optional resistors) incorporated within or supported by the shell of the ear-worn electronic device 1602.

One or more microphones 1606 are electrically connected to the mother flexible circuit 1603, which provides electrical communication between the microphones 1606 and a digital signal processor (DSP) 1604. Among other components, the DSP 1604 incorporates, or is coupled to, audio signal processing circuitry. The DSP 1604 has an audio output stage coupled to a receiver 1612. The receiver 1612 (e.g., a speaker) transforms the electrical signal into an acoustic signal. An optional sensor arrangement 1620, which can include one or more physiologic sensors, is coupled to the DSP 1604 via the mother flexible circuit 1603. One or more user switches 1608 (e.g., on/off, volume, mic directional settings) are electrically coupled to the DSP 1604 via the flexible mother circuit 1603.

The ear-worn electronic device 1602 may incorporate a communication device 1607 coupled to the flexible mother circuit 1603 and to an antenna 1609 via the flexible mother circuit 1603. The communication device 1607 can be a Bluetooth® transceiver, such as a BLE (Bluetooth® low energy) transceiver or other transceiver (e.g., an IEEE 802.11 compliant device). The communication device 1607 can be configured to communicate with one or more external devices, such as a smartphone, tablet, laptop, TV or streaming device.

This document discloses numerous embodiments, including but not limited to the following:

Item 1 is an ear-worn electronic device, comprising:
a shell defining an enclosure of the device;
electronics disposed within a void in the enclosure; and
one or more capacitors on or within the shell and coupled to the electronics.

Item 2 is the ear-worn electronic device of Item 1, wherein the one or more capacitors define one or more structural portions of the shell.

Item 3 is the ear-worn electronic device of Item 1, wherein the one or more capacitors comprise one or more supercapacitors.

Item 4 is the ear-worn electronic device of Item 1, wherein the one or more supercapacitors comprise one or more fiber supercapacitors.

Item 5 is the ear-worn electronic device of Item 4, wherein the one or more fiber supercapacitors comprise one or more coaxial fiber elements.

Item 6 is the ear-worn electronic device of Item 4, wherein the one or more fiber supercapacitors comprise a weave of fiber elements.

Item 7 is the ear-worn electronic device of Item 4, wherein the one or more fiber supercapacitors comprise stacked fiber elements.

Item 8 is the ear-worn electronic device of Item 4, wherein the one or more fiber supercapacitors comprise nanofibers.

Item 9 is the ear-worn electronic device according to Item 1, comprising one or more resistors on or within the shell and coupled to the electronics, wherein the one or more capacitors and the one or more resistors are part of a common circuit.

Item 10 is the ear-worn electronic device according to Item 9, wherein the one or more resistors comprise one or more fiber resistors.

Item 11 is the ear-worn electronic device of Item 1, wherein:
the one or more capacitors comprise one or more supercapacitors; and
the one or more supercapacitors serve as a primary rechargeable power source for the ear-worn electronic device.

Item 12 is an ear-worn electronic device, comprising:
a shell defining an enclosure of the device;
electronics disposed within a void of the enclosure; and
one or more capacitors on or within the shell and coupled to the electronics;
wherein the one or more capacitors are part of a circuit of the electronics that provides power management for the ear-worn electronic device.

Item 13 is the ear-worn electronic device of Item 12, wherein the one or more capacitors define one or more structural portions of the shell.

Item 14 is the ear-worn electronic device of Item 12, wherein the one or more capacitors comprise one or more supercapacitors.

Item 15 is the ear-worn electronic device of Item 14, wherein the one or more supercapacitors comprise one or more fiber supercapacitors.

Item 16 is the ear-worn electronic device of claim 15, wherein the one or more fiber supercapacitors comprise one or more coaxial fiber elements, a weave of fiber elements, stacked fiber elements, or nanofibers.

Item 17 is the ear-worn electronic device of Item 12, wherein one or more resistors are disposed on or within the shell; and
the one or more capacitors and the one or more resistors are part of the circuit of the electronics that provides power management for the ear-worn electronic device.

Item 18 is the ear-worn electronic device according to Item 17, wherein the one or more resistors comprise one or more fiber resistors.

Item 19 is the ear-worn electronic device of Item 17, wherein the one or more capacitors comprise one or more supercapacitors.

Item 20 is the ear-worn electronic device of Item 12, wherein:
the one or more capacitors comprise one or more supercapacitors; and
the one or more supercapacitors serve as a primary rechargeable power source for the ear-worn electronic device.

Although the subject matter has been described in language specific to structural features and/or methodological acts, it is to be understood that the subject matter defined in the appended claims is not necessarily limited to the specific features or acts described above. Rather, the specific features and acts described above are disclosed as representative forms of implementing the claims.

What is claimed is:

1. An ear-worn electronic device, comprising:
a shell comprising a wall and defining an enclosure of the device;
electronics disposed within a void in the enclosure; and
one or more capacitors within the shell wall and coupled to the electronics;
wherein the one or more capacitors define one or more structural portions of the shell wall and cooperate with material of the shell wall to provide mechanical integrity of the shell.

2. The ear-worn electronic device of claim 1, wherein the one or more capacitors comprise one or more supercapacitors.

3. The ear-worn electronic device of claim 1, wherein the one or more supercapacitors comprise one or more fiber supercapacitors.

4. The ear-worn electronic device of claim 3, wherein the one or more fiber supercapacitors comprise one or more coaxial fiber elements.

5. The ear-worn electronic device of claim 3, wherein the one or more fiber supercapacitors comprise a weave of fiber elements.

6. The ear-worn electronic device of claim 3, wherein the one or more fiber supercapacitors comprise stacked fiber elements.

7. The ear-worn electronic device of claim 3, wherein the one or more fiber supercapacitors comprise nanofibers.

8. The ear-worn electronic device according to claim 1, comprising one or more resistors on or within the shell wall and coupled to the electronics, wherein the one or more capacitors and the one or more resistors are part of a common circuit.

9. The ear-worn electronic device according to claim 8, wherein the one or more resistors comprise one or more fiber resistors.

10. The ear-worn electronic device of claim 1, wherein:
the one or more capacitors comprise one or more supercapacitors; and
the one or more supercapacitors serve as a primary rechargeable power source for the ear-worn electronic device.

11. The device of claim 1, wherein the one or more capacitors are integrated into, and in part make up, a portion of the shell wall.

12. An ear-worn electronic device, comprising:
a shell comprising a wall and defining an enclosure of the device;
electronics disposed within a void in the enclosure; and
one or more capacitors within the shell wall and coupled to the electronics;
wherein the one or more capacitors are part of a circuit of the electronics that provides power management for the ear-worn electronic device, and the one or more capacitors define one or more structural portions of the shell wall and cooperate with material of the shell wall to provide mechanical integrity of the shell.

13. The ear-worn electronic device of claim 12, wherein the one or more capacitors comprise one or more supercapacitors.

14. The ear-worn electronic device of claim 13, wherein the one or more supercapacitors comprise one or more fiber supercapacitors.

15. The ear-worn electronic device of claim 14, wherein the one or more fiber supercapacitors comprise one or more coaxial fiber elements, a weave of fiber elements, stacked fiber elements, or nanofibers.

16. The ear-worn electronic device of claim 12, wherein:
one or more resistors are disposed on or within the shell wall; and
the one or more capacitors and the one or more resistors are part of the circuit of the electronics that provides power management for the ear-worn electronic device.

17. The ear-worn electronic device according to claim 16, wherein the one or more resistors comprise one or more fiber resistors.

18. The ear-worn electronic device of claim 16, wherein the one or more capacitors comprise one or more supercapacitors.

19. The ear-worn electronic device of claim 12, wherein:
the one or more capacitors comprise one or more supercapacitors; and
the one or more supercapacitors serve as a primary rechargeable power source for the ear-worn electronic device.

20. The device of claim 12, wherein the one or more capacitors are integrated into, and in part make up, a portion of the shell wall.

* * * * *